United States Patent

Fallica

[19]

[11] Patent Number: 5,854,506
[45] Date of Patent: *Dec. 29, 1998

[54] SEMICONDUCTOR PARTICLE-DETECTOR

[75] Inventor: Piero G. Fallica, Catania, Italy

[73] Assignee: Consorzio per la Ricerca sulla Microelettronica nel Mezzogiorno, Catania, Italy

[*] Notice: This patent issued on a continued prosecution application filed under 37 CFR 1.53(d), and is subject to the twenty year patent term provisions of 35 U.S.C. 154(a)(2).

[21] Appl. No.: 607,511

[22] Filed: Feb. 27, 1996

Related U.S. Application Data

[60] Provisional application No. 60/007,760 Nov. 30, 1995.

[30] Foreign Application Priority Data

Feb. 27, 1995 [EP] European Pat. Off. ............. 95830060

[51] Int. Cl.$^6$ .................. G01T 1/24; H01L 31/00
[52] U.S. Cl. .............. 257/429; 250/370.01; 250/370.03; 250/370.14
[58] Field of Search ................. 257/428, 429, 257/430, 544; 250/370.01, 370.02, 370.14, 370.03

[56] References Cited

U.S. PATENT DOCUMENTS

| 4,055,765 | 10/1977 | Gerber et al. | 257/429 |
| 4,174,562 | 11/1979 | Sanders et al. | 257/544 |
| 4,903,103 | 2/1990 | Yamashita et al. | 257/544 |
| 5,286,986 | 2/1994 | Kihara et al. | 257/565 |

FOREIGN PATENT DOCUMENTS

| 0383389 | 2/1990 | European Pat. Off. . |
| 61-75569 | 4/1986 | Japan . |
| 64-37879 | 2/1989 | Japan . |
| 6-302844 | 10/1994 | Japan . |
| 6-310702 | 11/1994 | Japan . |

OTHER PUBLICATIONS

Kemmer et al., "New structures for position sensitive semiconductor detectors," London Conf. on Position Specific Detectors, 7–11 Sep. 1987.

Martin, "Interated E and dE/dx semiconductor particle detectors made by ion implantation," Nuclear Instruments and Methods, 15 Jul. 1969, Nether lands, vol. 72, No. 2.

Kemmer et al., "New Detector Concepts," Nuclear Instruments and Methods in Physics Research, vol. A253, No. 3,15 Jan. 1987, pp. 365–377.

*Primary Examiner*—John Guay
*Attorney, Agent, or Firm*—Wolf, Greenfield & Sacks, P.C.

[57] ABSTRACT

A particle-detector is formed on a die of semiconductor material (20) comprising: first and second layers (22, 23) with a first type of conductivity (N), a third layer (21) with a second type of conductivity (P), interposed between the first and second layers (22, 23), first and second means (25, 31; 26, 32) for electrical connection with the first and second layers (22, 23), respectively, disposed on the opposite surfaces thereof to those of the junctions with the third layer (21) and third means (27, 24) for electrical connection with the third layer (21).

To permit large-scale industrial manufacture, the third means (27, 24) for electrical connection with the third layer (21) comprise a region (24) with the second type of conductivity (P) which extends from the front face of the die as far as the third layer (21) and means (27) for surface electrical contact with this region.

14 Claims, 1 Drawing Sheet

SEMICONDUCTOR PARTICLE-DETECTOR

CROSS-REFERENCE TO RELATED APPLICATION

This application claims priority from provisional 60/007,760 filed Nov. 30, 1995 and EPC Application 95830060.0 filed Feb. 27, 1995, both of which are hereby incorporated by reference.

BACKGROUND AND SUMMARY OF THE INVENTION

The present invention relates to devices for detecting atomic or nuclear particles and, more particularly, to a semiconductor particle-detector of the type defined in the preamble to the first of the claims which follow the present description, as well as to methods for the manufacture thereof.

During the study of nuclear reactions brought about in the laboratory, it is necessary to detect and identify heavy nuclear particles, that is, ions of atoms with high atomic numbers, or nuclear fission fragments or, in any case, nuclear-reaction products. Similar requirements generally arise during the analysis of radiation phenomena with the emission of particles, as in cosmic-ray analysis.

In order to identify a particle, it is necessary to measure various quantities associated therewith, such as the kinetic energy, the momentum (vectorial), and the atomic mass and number.

A known method of measuring mass and energy provides for the use of a thick semiconductor detector (typically 300–400 microns thick) and a thin semiconductor detector (typically from a few microns to a few tens of microns thick) which are disposed on the path of the particle. The particle interacts firstly with the thin detector, losing only some of its energy ($\Delta E$), and then with the thick detector, to which it yields all of its residual energy ($E-\Delta E$), where E represents the total energy of the particle at the moment of impact with the thin detector. Since the loss of energy $\Delta E$ through the thin detector is more or less directly proportional to the mass and inversely proportional to the total energy E, a measurement of $\Delta E$ and $E-\Delta E$ enables the mass of the particle to be found.

When the particles to be detected are particularly heavy or have relatively low energy, the $\Delta E$ detectors have to be very thin to take account of the low penetration capacity and are therefore very fragile and very expensive. Moreover, if the detector also has to be able to give information on the spatial distribution of the particles, that is, to be a position detector, its sensitive area must be quite extensive. Naturally, this need conflicts with the need to have very small thicknesses, and the surface areas of position detectors which can be produced by the usual techniques for reducing thickness are thus quite limited; in practice they do not exceed one square centimeter.

In order to overcome this limitation, a composite $\Delta E$ and E detector, which is shown schematically in FIG. 1 of the appended drawings and can be produced on a single piece of semiconductor, has been proposed (Nuclear Instruments and Methods in Physics Research (1987 p. 365–377). It is produced by implanting boron ions with high energy (10.8 MeV) in a semiconductor wafer doped with N-type impurities. This produces a highly doped P-type layer about 0.6 microns thick, indicated 11, buried at a depth of about 12 microns from the implantation surface, that is, a P+ layer interposed between two N layers, indicated 12 and 13 in the drawing. The wafer is then cut into square dice of the desired dimensions, such as that indicated 10 in the drawing, and the individual dice are subjected to a treatment for the deposition and diffusion of boron at high temperature to form a P+ type region, indicated 14, on their side surfaces in contact with the edges of the buried P+ layer 11. Metal electrodes, indicated 15, 16 and 17, respectively, are formed on the front and rear surfaces as well as on the side surfaces in order to establish electrical contact with the two layers and with the buried layer.

Before the electrodes 15 and 16 are formed on the front and on the rear of the die, the semiconductor is enriched with N-type impurities, as shown in the drawing by the N+ regions indicated 8 and 9.

Two diodes having a common anode constituted by the buried layer are thus produced on the same die. The upper, thin diode constitutes the $\Delta E$ detector and the thick, lower diode constitutes the E detector.

In operation, two voltages, V1 and V2, respectively, relative to a common terminal represented by the ground symbol in the drawing, are applied between the upper and lower electrodes 15 and 16 and the side electrode 17 in operation, their signs being such as to bias the two diodes in opposite directions. Two depletion regions are thus formed and constitute the active parts of the two detectors. A particle to be detected, represented by an arrow with a broken line, strikes the front surface of the composite detector and, passing through the two depletion regions causes the formation of electron-hole pairs which move towards the electrodes forming pulsed currents. These currents are collected and amplified by suitable circuits, generally indicated 18 and 19, and are then measured and displayed by means of a suitable electronic device, indicated as 7, to give an indication of the quantities $\Delta E$ and $E-\Delta E$, and hence of the masses of the incident particles.

With the known detector described above, the $\Delta E$ detector portion can be made very thin without problems of fragility, since it is integral with the thicker E-detector portion. However, this detector is not suitable for large-scale manufacture because a considerable proportion of the necessary steps (the formation of the lateral P+ region, the formation of the electrodes) has to be carried out individually for each die after the wafer has been cut. Moreover, it cannot operate as a position detector.

An object of the present invention is to propose a semiconductor particle-detector having a structure which is suitable for large-scale manufacture.

Another object is to propose a semiconductor particle-detector which can operate as a position detector.

Yet another object is to propose at least one method of manufacturing the novel particle-detector.

These objects are achieved by the provision of the detector and method embodiments defined in general in the following claims.

BRIEF DESCRIPTION OF THE DRAWING

The disclosed inventions will be described with reference to the accompanying drawings, which show important sample embodiments of the invention and which are incorporated in the specification hereof by reference, wherein.

The invention and the advantages derived therefrom will be understood better from the following detailed description of two embodiments thereof which are given purely by way of non-limiting example with reference to the appended drawings, in which.

DETAILED DESCRIPTION OF THE PREFERRED EMBODIMENTS

Figure 1:
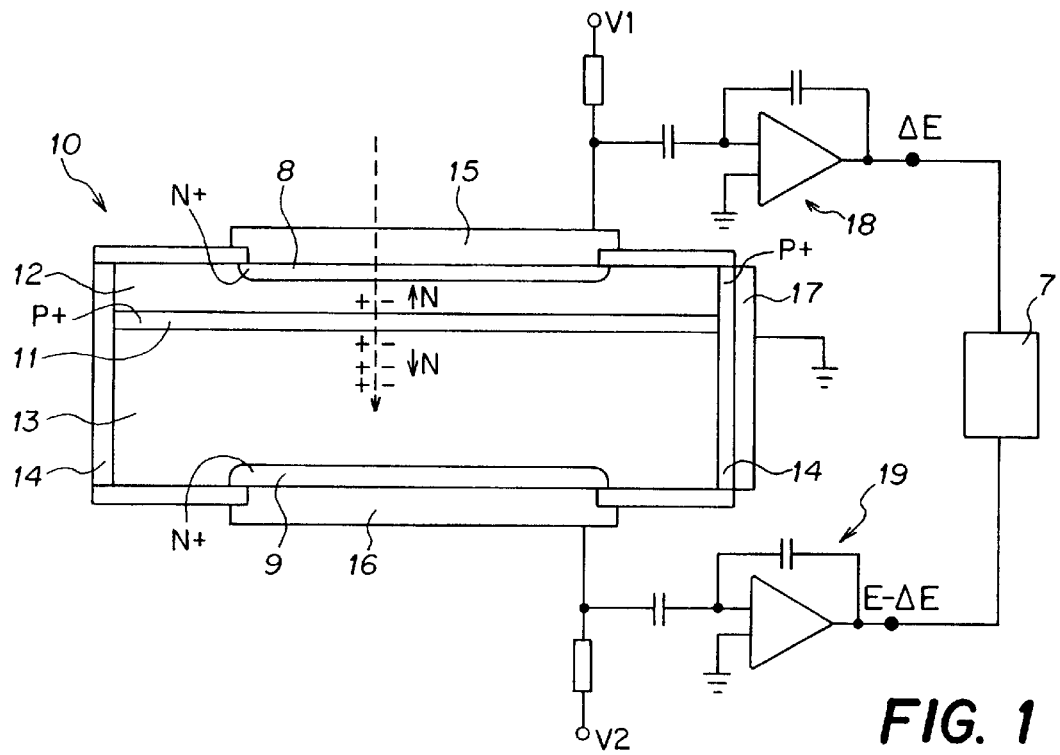
FIG. 1, which has already been described, shows, in section, a particle-detector according to the prior art and some circuits which, together with the detector, constitute a particle-detection device.
Figure 2:
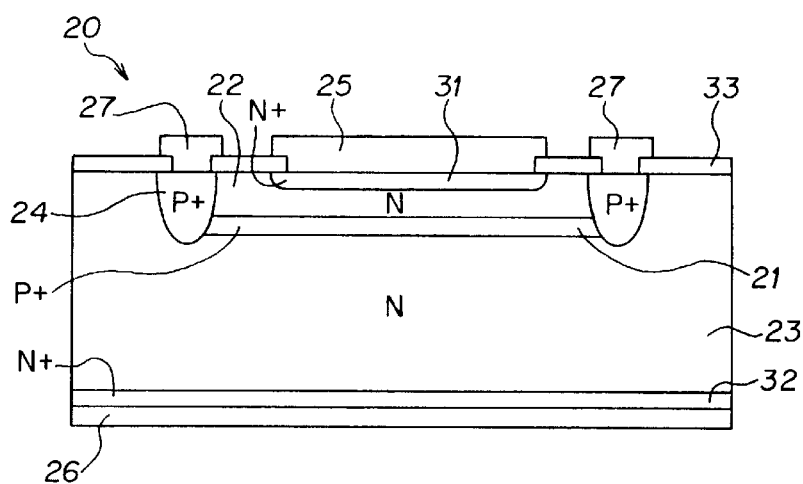
FIGS. 2 and 3 show, in section, particle-detectors according to two respective embodiments of the invention.

The numerous innovative teachings of the present application will be described with particular reference to the presently preferred embodiment (by way of example, and not of limitation), in which:

As can be seen in FIG. 2, the detector according to the invention is formed in a single die of semiconductor material, for example, monocrystalline silicon, generally indicated 20, which comprises three superimposed layers: two N-type layers, an upper layer 22 and a lower layer 23, and a P-type layer 21 which is highly doped and is thus marked P+ and is buried, that is, interposed between the two N-type layers. Unlike the known structure shown in FIG. 1, the P+ layer 21 extends only to a certain distance from the edge of the die. For electrical contact with the P+ layer 21, there is a region 24 which is also a highly doped P-type region extending from the upper or front surface of the die as far as the P+ layer 21 and, on the surface, has a contact element in the form of a metal strip 27, for example, of aluminum. Seen in plan, the P+ contact region 24 preferably has the shape of a square frame. However, it could also be constituted simply by one or two strips or even by a plurality of isolated regions. Similarly, the metal contact may also be shaped differently.

The upper layer 22 and the lower layer 23 are contacted electrically by means of two N-type surface regions which are highly doped and hence are marked N+, indicated 31 and 32, respectively, and by means of two metal layers 25 and 26, respectively. The latter, together with the metal strip 27, constitute the terminal electrodes of the detector and serve to connect the detector to biasing voltage sources and to amplifier circuits, processors and indicators similar to those already described briefly in connection with the known detector. The upper electrode is preferably formed as a very thin layer to reduce as much as possible its screening effect with respect to the incident particles. Alternatively, instead of extending over the entire surface region 31, it may extend solely along a peripheral region thereof, like a frame. The upper surface of the die is covered by a layer of insulating material, typically silicon dioxide, indicated 33, in which holes are formed for the contacts of the electrodes 25 and 27.

It should be noted that the depletion region of the lower diode, that is, that formed by the buried P+ layer 21 and by the N layer 23, extends deeply into the N layer 23 and also laterally to the P+ regions 24. The structure is preferably of a size such that the portion of the N layer 23 between the P+ region 24 and the edge of the die 20 is wider than the maximum extent of the depletion region.

The structure described above can be manufactured in large numbers from the same silicon wafer and does not require manufacturing steps after the wafer has been cut into dice. This permits large-scale industrial manufacture.

Two methods of producing the detector structure according to the invention will now be described.

The first method provides for the following principal steps, carried out on an N-type monocrystalline silicon wafer:

a. the formation of a silicon dioxide ($SiO_2$) layer on the entire front face of the wafer by growing at high temperature in an oxidizing atmosphere, b. the opening, in the $SiO_2$ layer, of windows with dimensions corresponding to those desired for the P+ contact regions 24, by the usual techniques of masking and selective removal of material, c. the implantation of boron ions at a high dose ($10^{14}$–$10^{15}$ a/cm$^2$) and with low energy (60–80 KeV) on the front face of the wafer, d. high-temperature diffusion in an oxidizing atmosphere to form P+ regions 24 and to form an $SiO_2$ layer on the uncovered areas of the front face of the wafer, e. the opening, in the $SiO_2$ layer of windows with dimensions corresponding to those desired for the buried P+ layer 21, f. the implantation of boron ions at a high dose ($10^{14}$–$10^{15}$ a/cm$^2$) and with high energy (0.5–3 MeV), so as to form the P+ layer 21 at a depth of 1–3 microns from the front face and with a thickness of 0.5–1 microns, g. the formation of a new $SiO_2$ layer on the uncovered front areas, h. the opening of windows with dimensions corresponding to those desired to form an enriched N+ surface region, i. the implantation of arsenic ions at a high dose (about $10^{15}$ a/cm$^2$) and with low energy (40–60 KeV) on the front face of the wafer, l. the implantation of phosphorus ions at a high dose ($10^{15}$–$10^{16}$ a/cm$^2$) and with low energy (80 KeV) on the rear of the wafer, m. the formation of a new $SiO_2$ layer on the uncovered front areas, n. the opening of windows with dimensions corresponding to those desired to form the contacts for the electrodes 25 and 27, o. the deposition of a layer of aluminum on the front face of the wafer, p. the selective removal of aluminum from the layer to define the electrodes 25 and 27, q. the deposition of a layer of aluminum on the rear of the wafer, r. the division of the wafer into dice.

The second method provides for the following principal steps, carried out on an N-type monocrystalline silicon wafer:

initial oxidation as in step a. of the method described above, the opening of windows as in step b, the implantation of boron ions at a high dose ($10^{14}$–$10^{15}$ a/cm$^2$) and with low energy (40–80 KeV), high-temperature heat treatment (900°–1100° C.) to allow the boron to diffuse to a depth of about 1 micron, the removal of the $SiO_2$ formed during the previous step, the formation of an N-type monocrystalline layer on the front face of the wafer by epitaxial growth at high temperature to produce the N layer 22, the formation of an $SiO_2$ layer on the front face of the wafer (the surface of the epitaxial layer), the formation of P+ contact regions 24 as in steps b. to d. of the method described above, the formation of enriched regions and the formation of the electrodes on the front face and on the rear of the wafer as in steps h. to q. of the method described above, the division of the wafer into dice.

Figure 3:
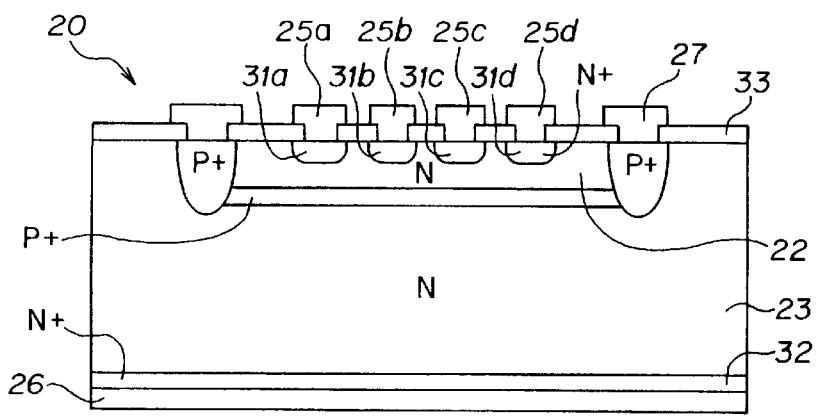

The embodiment of FIG. 3, in which the reference numerals correspond to the same parts as in FIG. 2, represents a position detector. The only difference in comparison with the structure of FIG. 2 is that, instead of a single contact on the front face of the die, four parallel contact strips, indicated 25a, 25b, 25c and 25d are provided and, instead of a single enriched N+ region, a number of regions, indicated 31a, 31b, 31c and 31d, equal to the number of contact strips, is provided.

In operation, each electrode is disconnected from the others so as to provide a datum on the pulsed current produced solely in a strip of the underlying depletion region and, therefore, on the relative positions of the incident particles.

According to another embodiment of the invention which permits even more precise determination of the impact positions of the particles, a plurality of contact elements of small dimensions as independent cathode electrodes is provided on the front face of the die.

It is clear from the foregoing that the detector according to the invention can be produced without problems with very extensive active surfaces and, as already stated, by large-scale industrial production methods.

Although only two embodiments of the invention have been described and illustrated, clearly many variations and modifications are possible within the scope of the same inventive concept. For example, instead of being formed by a N/P+/N series of layers, the structures described could be constituted by a P/N+/P series of layers and the manufacturing methods could be modified correspondingly with the use of techniques wholly similar to those described and dopants of the opposite types to those indicated.

Additional background on particle detectors may be found, for example, in G. Lutz, Silicon radiation detectors, NUCLEAR INSTRUMENTS & METHODS IN PHYSICS RESEARCH, Section A vol. 367, no. 1–3 p. 21–33 (1995); and in SEMICONDUCTORS FOR ROOM TEMPERATURE NUCLEAR DETECTOR APPLICATIONS (ed. T. E. Schlesinger and R. B. James 1995), which is vol. 43 of the SEMICONDUCTORS AND SEMIMETALS series; both of which are hereby incorporated by reference.

According to a disclosed class of innovative embodiments, there is provided: A solid-state detector for energetic particles, comprising: a substantially monolithic semiconductor body, comprising first and second carrier collection regions of a first conductivity type, vertically separated by a buried layer of a second conductivity type; said first collection region forming a junction with said buried layer, and extending therefrom substantially to a front surface of said body; said second collection region forming a junction with said buried layer and extending therefrom substantially to a back surface of said body, and being more than 3 times as thick as said first collection region; a first electrical connection which provides contact to said first collection region near said front surface of said body; a second electrical connection which provides contact to said first collection region near said back surface of said body; a third electrical connection which extends down from said front surface of said body to make contact to said buried layer; wherein said buried layer, and said third electrical connection, do not extend to the edge of said body; whereby, when said first and second connections are both reverse-biased with respect to said buried layer, currents thereat provide an indication of particle absorption in said first and second collection regions.

According to another disclosed class of innovative embodiments, there is provided: A solid-state detector for energetic particles, comprising: a substantially monolithic semiconductor body, comprising first and second first-conductivity-type carrier collection regions, vertically separated by a second-conductivity-type buried layer; said first collection region forming a junction with said buried layer, and extending therefrom substantially to a front surface of said body, and forming junctions with a plurality of first-conductivity-type carrier output regions at said front surface; said second collection region forming a junction with said buried layer and extending therefrom substantially to a back surface of said body, and being more than 3 times as thick as said first collection region, and forming junctions with a second-conductivity-type carrier output region at said back surface; a plurality of first electrical connections which provide contact to said respective first-conductivity-type carrier output regions near said front surface of said body; a second electrical connection which provides contact to said second-conductivity-type carrier output region near said back surface of said body; and a third electrical connection which extends down from said front surface of said body to make contact to said buried layer; wherein said buried layer, and said third electrical connection, do not extend to the edge of said body; whereby, when said first and second connections are both reverse-biased with respect to said buried layer, currents thereat provide an indication of particle absorption in said first and second collection regions.

According to another disclosed class of innovative embodiments, there is provided: A particle-detector formed on a die of semiconductor material comprising: a first layer with a first type of conductivity having a surface on the front face of the die, a second layer with the first type of conductivity having a surface on the rear face of the die, a third layer with a second type of conductivity interposed between the first and second layers and extending laterally only to a certain distance from the edge of the die, first and second means for electrical connection with the first layer and the second layer, respectively, disposed on the surfaces thereof, and third means for electrical connection with the third layer, characterized in that the third electrical connection means comprise a region with the second type of conductivity which extends from the front face of the die as far as the third layer and means for surface electrical contact with this region.

According to another disclosed class of innovative embodiments, there is provided: A method of forming a particle-detector on a die of semiconductor material with a first type of conductivity, having a front face and a rear face, comprising the following steps: the implantation of doping material through the front face of the die at a dose and with energy such as to form a layer with a second type of conductivity interposed between two layers with the first type of conductivity which have surfaces on the front face and on the rear face of the die, respectively, the formation of electrical connection means on the surfaces of these latter two layers, and the formation of means for electrical connection with the interposed layer, characterized in that the formation of means for electrical connection with the interposed layer comprises the formation of a region with the second type of conductivity extending from the front face of the die as far as the interposed layer, and the formation of means for surface electrical contact with this region.

According to another disclosed class of innovative embodiments, there is provided: A method of forming a particle-detector on a die of semiconductor material starting with a substrate with a first type of conductivity, characterized by the following steps: the formation of a layer with a second type of conductivity by surface doping of the substrate, the formation of a layer with the first type of conductivity N on the layer with the second type of conductivity by epitaxial growth on the substrate, —the formation of electrical connection means on the surfaces of the substrate and of the epitaxial layer opposite those of the junctions with the layer with the second type of conductivity, and the formation of means for electrical connection with the layer with the second type of conductivity by the formation of a region with the second type of conductivity extending from the free surface of the epitaxial layer as far as the layer with the second type of conductivity and the formation of means for surface electrical contact with this region.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For example, in one class of embodiments the illustrated detector may be the only electronic structure on a single chip.

What is claimed is:

1. A particle-detector formed on a die of semiconductor material comprising:
    a first layer with a first type of conductivity having a surface on the front face of the die,
    a second layer with the first type of conductivity having a surface on the rear face of the die,
    a third layer with a second type of conductivity interposed between the first and second layers and extending laterally only to a certain distance from the edge of the die,
    first and second means for electrical connection with said first layer and said second layer, respectively, disposed on the surfaces thereof, and
    third means for electrical connection with the third layer,
    wherein the third electrical connection means comprise a region with the second type of conductivity which extends from the front face of the die as far as the third layer and means for surface electrical contact with this region;
    wherein said certain distance between the edge of the die and said third layer is chosen so that a depletion region formed between said third and said second layers during operation of said particle-detector does not reach the sidewall of the die.

2. A particle-detector according to claim 1, in which the first layer is thinner than the second layer.

3. A particle-detector according to claim 2, in which the region with the second type of conductivity is in contact with edge regions of the third layer and extends laterally as far as a predetermined distance from the edge of the die.

4. A particle-detector according to claim 2, in which the first means for electrical connection with the first layer comprise a plurality of strips of electrically-conductive material insulated from one another.

5. A particle-detector according to claim 2, in which the first means for electrical connection with the first layer comprise a plurality of contact elements insulated from one another.

6. A device comprising the detector of claim 2, comprising means connected to the first, second and third electrical connection means, for biasing in opposite directions the two junctions formed by the first layer and by the second layer with the third layer, for detecting currents through the junctions, for obtaining and processing signals associated with the currents detected, and for displaying the results of the processing of the signals.

7. A particle-detector according to claim 1, in which the region with the second type of conductivity is in contact with edge regions of the third layer and extends laterally as far as a predetermined distance from the edge of the die.

8. A particle-detector according to claim 7, in which the first means for electrical connection with the first layer comprise a plurality of strips of electrically-conductive material insulated from one another.

9. A particle-detector according to claim 7, in which the first means for electrical connection with the first layer comprise a plurality of contact elements insulated from one another.

10. A device comprising the detector of claim 7, comprising means connected to the first, second and third electrical connection means, for biasing in opposite directions the two junctions formed by the first layer and by the second layer with the third layer, for detecting currents through the junctions, for obtaining and processing signals associated with the currents detected, and for displaying the results of the processing of the signals.

11. A particle-detector according to claim 1, in which the first means for electrical connection with the first layer comprise a plurality of strips of electrically-conductive material insulated from one another.

12. A particle-detector according to claim 1, in which the first means for electrical connection with the first layer comprise a plurality of contact elements insulated from one another.

13. A device comprising the detector of claim 11, comprising means connected to the first, second and third electrical connection means, for biasing in opposite directions the two junctions formed by the first layer and by the second layer with the third layer, for detecting currents through the junctions, for obtaining and processing signals associated with the currents detected, and for displaying the results of the processing of the signals.

14. The detector of claim 1, wherein said third means for electrical connection forms a square frame around said third layer.

* * * * *